United States Patent [19]

Eggermont

[11] 4,052,605
[45] Oct. 4, 1977

[54] INTERPOLATING NON-RECURSIVE DIGITAL FILTER

[75] Inventor: Ludwig Désiré Johan Eggermont, Eindhoven, Netherlands

[73] Assignee: U.S. Philips Corporation, New York, N.Y.

[21] Appl. No.: 689,947

[22] Filed: May 25, 1976

[30] Foreign Application Priority Data

May 29, 1975 Netherlands .......................... 7506333

[51] Int. Cl.² .............................................. G06F 15/34
[52] U.S. Cl. .................................... 364/724; 328/167; 333/70 T
[58] Field of Search .................. 235/152, 156; 333/18, 333/28 R, 70 T; 328/167

[56] References Cited

U.S. PATENT DOCUMENTS 3,928,755  12/1975  Bellanger et al. ..................... 235/152
3,965,338   6/1976  Van Gerwen et al. ..........: 235/156 X Primary Examiner—Jerry Smith
Attorney, Agent, or Firm—Steven R. Biren; Frank R. Trifari

[57] ABSTRACT

An interpolating non-recursive digital filter for generating output signal samples which occur at a given output sampling frequency and which are related in a predetermined way to a sequence of input signal samples has an output sampling frequency which is an integer multiple of the frequency of the input signal samples. In order to make more efficient use of the storage capacity of a storage device in the filter, multiplying coefficients representative of the difference between two samples of the impulse response which belong to different sets but to the same sampling period are used.

3 Claims, 2 Drawing Figures

INTERPOLATING NON-RECURSIVE DIGITAL FILTER

BACKGROUND OF THE INVENTION

1. Field to Which the Invention Relates

The invention relates to an interpolating non-recursive digital filter for generating output signal samples which occur at a given output sampling frequency $f_2$ and which are related in a predetermined way to a sequence of input signal samples which occur at an input sampling frequency $f_1$, $f_2$ being an integer multiple $r$ of the frequency $f_1$, comprising: means for storing a sequence of N input signal samples $x(nT)$, $x[(n-1)T]$, $x[(n-2)T]$, ... $x[(n-N+1)T]$ where $n$ represents the number of the signal sample which occurred after the instant $t=0$; multiplying the adder means for generating within an input sampling period $T=1/f_1$ a set of $r$ successive output signal samples $y[(n+m/r)T]$ where $m = 0, 1, 2, \ldots r-1$, the relation between the N input signal samples and an output signal sample being expressed by $$y[(n + m/r)T] = \sum_{k=0}^{N-1} a(m,k) \cdot x[(n-k)T].$$

In this equation $r$ is the interpolation factor and $a(m,0)$, $a(m,1)$, $a(m,2)$, ... $a(m,N-1)$ are elements of a set of multiplying coefficients $a[m,k]$ of $r$ mutually different sets of multiplying coefficients, each comprising N elements.

In what follows hereinafter the sets of coefficients will be designated with square brackets as $a[m,k]$ and the elements of such a set with round brackets as $a(m,k)$.

2. Description of the Prior Art

In chapter (D) a number of references are specified in which interpolating non-recursive digital filters are described. As is described more particularly for the interpolating digital filter indicated in reference 3, the N input signal samples are stored in, for example, a circulating delay line and the sets of multiplying coefficients $a[m,k]$ where $m = 0, 1, 2, \ldots r-1$ have been stored in a storage device such as, for example, an ROM. Under the control of an address code a set of multiplying coefficients which is characterized by a given value of $m$ is read from the ROM and supplied to the multiplying means. The multiplying means now supply a set of sub-products of the form: $a(m,0).x(nT)$, $a(m,1).x[(n-1)T]$, $a(m,2).x[(n-2)T]$. . . . . . $a(m,N-1).x[(n-N+1)T]$. The sub-products belonging to such a set are subsequently added together by the adder means such as, for example, an accumulator so that the output signal sample $y[(n+m/r)T]$ is obtained. After this signal sample has been read from the accumulator the latter is reset to its zero position and thereafter a new set of multiplying coefficients $a[m+1,k]$ is read from the ROM for generating the output signal sample $y[(n+(m+1)/r)T]T]$ whereafter the above process is repeated. When the output sampling frequency is increased by a factor $r$ ($r$ being an integer and exceeding (1) relative to the input sampling frequency the above described processing of the stored N input samples is repeated for each of the $r$ sets of multiplying coefficients. Thereafter a new input signal sample $x[(n+1)T]$ is written into the storage device, and the oldest input signal sample $x[(n-N+1)T]$ disappears from the storage device. For generating the output signal samples $y[\{(n+1)+m/r\}T]$ where $m = 0, 1, 2, \ldots r-1$ the above processes are performed on the new sequence of N input signal samples $x[(n+1)T]$, $x(nT)$, $x[(n-1)T]$, . . . $x[(n-N+2)T]$.

For performing the processing of the input signal samples in a fully digitalized digital filter the input signal sample $x(nT)$ as well as the multiplying coefficients $a(m,k)$ are usually numbers in the binary system. Consequently also the output signal samples $y[(n+m/r)T]$ are numbers in the binary system.

More particularly the numbers $x(nT)$ represent samples of an analog information signal which has been sampled in the usual manner with the input sampling frequency $f_1$ which samples have been quantized in a quantizer and thereafter converted to the code word $x(nT)$.

As has been described in detail in ref. 3 the sets of multiplying coefficients $a[m,k]$ where $m = 0, 1, 2, \ldots r-1$ represent coded samples of the impulse response of the filters to be realized. In the interpolating case, the impulse response is sampled $r$ times with a series of sampling pulses which occur one after the other at a period $T = 1/f_1$. To determine the successive sets of multiplying coefficients this series of sampling pulses is each time shifted over a time distance $T/r$ with respect to the previous series of sampling pulses.

If the filter to be realized is formed by an ideal low-pass filter having a cut-off frequency $f_1/2$, then the impulse response of this filter has the known form which can be mathematically represented by:

$$f_1 T \frac{\sin 2\pi nTf_1/2}{2\pi nTf_1/2} \tag{1}$$

To determine the multiplying coefficients this impulse response is now sampled with sampling pulses which occur at a period $T = 1/f_1$. The multiplying coefficients of the $m^{th}$ set $a[m,k]$ are now obtained by sampling this impulse response with a series of sampling pulses which can be mathematically represented by:

$$\sum_{j=-7}^{\infty} \delta[t - (j + m/r)T] \tag{2}$$

SUMMARY OF THE INVENTION

It is an object of the invention to provide an improved interpolating digital filter of the kind mentioned in the preamble so that a considerably more efficient use can be made of the storage capacity of the storage device such as, for example, a ROM in which normally the multiplying coefficients have been stored.

In accordance with the invention for the purpose of generating output signal samples $y[(n+m/r)T]T]$ sets of multiplication factors $b[m,k]$ where $m = 0, 1, 2, \ldots, r-1$ are supplied to the multiplying means, whilst the elements $b(m,k)$ of these sets have for $m \neq 0$ the form $b(m,k) = a(m,k) - a(m-1,k)$ and for $m = 0$ the form $b(m,k) = a(m,k)$; this filter being furthermore provided with means for resetting the adder means to the zero position exclusively after the occurrence of the $r^{th}$ output signal sample $y[\{n+(r-1)/r\}T]$ within said input sampling period T, which adder means supply said output signal samples $y[(n+m/r)T]$, the relation between these output signal samples and said multiplication factors being given by the equation:

$$y[(n + m/r)T] = \sum_{j=0}^{m} \sum_{k=0}^{N-1} b(j,k) \times [(n-k)T]$$

So in the interpolating digital filter in accordance with the invention, not the samples of the impulse response described in the preceding chapter (B) are used as multiplying coefficients but each time the difference between two samples of the impulse response which belong to different sets but to the same sampling period. Samples of the impulse response which belong to the same sampling period are those samples which are obtained by sampling the impulse response specified in equation (1) with the series of sampling pulses specified in equation (2) and more specifically by keeping the value of $j$ in equation (2) constant and by varying the value of $m$ from 0 to $r-1$ inclusive.

As the different code words which characterize the above-mentioned differences between every two multiplying coefficients can be represented by smaller word lengths than the multiplying coefficients themselves the time necessary for performing a multiplication is shortened. As only these difference code words are stored in a storage device such as, for example, an ROM, the number of different code words can be chosen to be larger with a given storage capacity of this ROM than the number of multiplying coefficients which could originally be stored in the ROM. This results in a more accurate approximation of the filter characteristic to be realized.

SHORT DESCRIPTION OF THE FIGURES

REFERENCES

1. Dutch Patent Application No. 7,400,761 and related U.S. Pat. No. 3,928,755.
2. A digital Signal Processing Approach to Interpolation; R. W. Schafer, L. R. Rabiner; Proceeding of the IEEE, Vol. 61 No. 6, Juni 1973.
3. Dutch Patent Application No. 7,412,224 and related U.S. Pat. No. 3,988,607.
4. Binary transversal filters using recirculating shift registers; G. B. Lockhart, S. P. Barbary; The Radio and Electronic Engineer, Vol. 43, No. 3, March 1973.

DESCRIPTION OF THE EMBODIMENT

1. The interpolating digital filter of FIG. 1.

Figure 1:
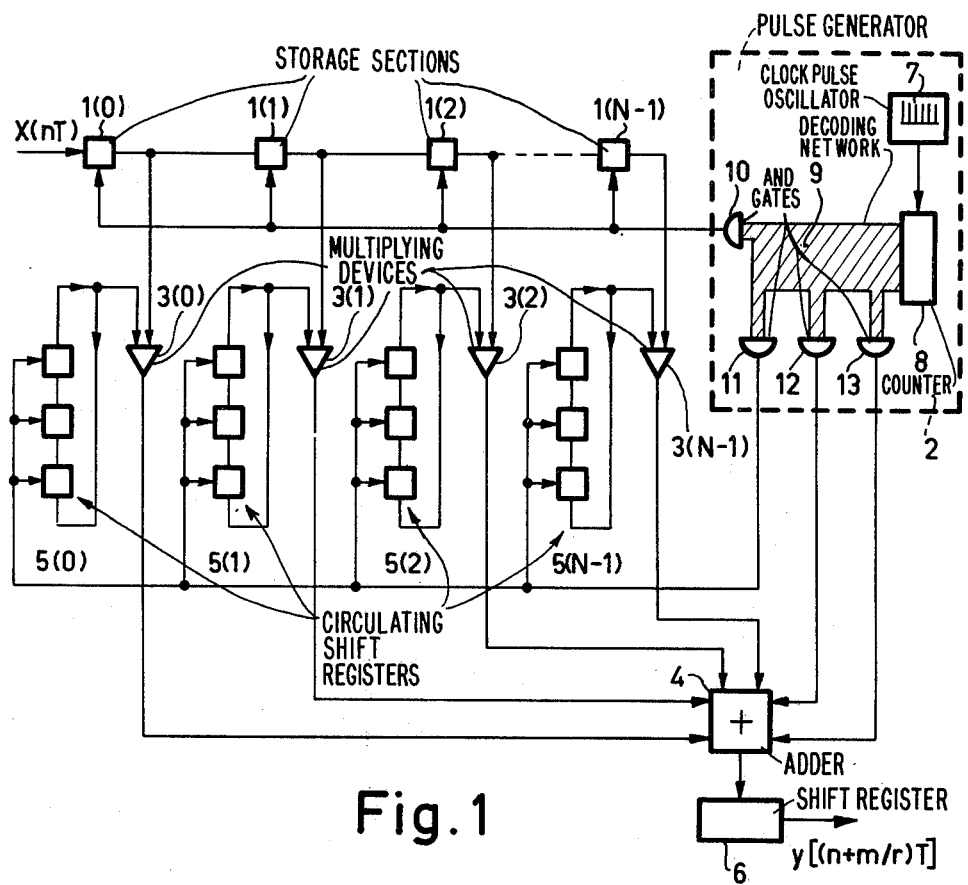
FIG. 1 shows an embodiment of an interpolating non-recursive digital filter according to the invention.

FIG. 1 shows an interpolating digital filter which comprises a cascade circuit of N storage sections 1(0) — 1(N−1) which are each arranged for storing a multi-bit input code word $x(nT)$. These input code words which occur within a period $T = 1/f_1$ are supplied to the input of the cascade circuit and shifted herein to the consecutive sections under the control of shift pulses which occur with a period T and which are generated by a pulse generator 2.

The outputs of the storage sections 1(.) are connected to inputs of multiplying devices 3(0) — 3(N-1) whose outputs are connected to inputs of an adder device 4. Besides the N stored input code words a set of multiplication factors $b[m,k]$ wherein $k = 0, 1, 2, \ldots N-1$ and $m = 0, 1, 2, \ldots r-1$ and whereby each set is characterized by a given value of $m$, are supplied to these multiplying devices 3(0) — 3(N−1), $r$ representing the interpolation factor.

In the embodiment shown, where $r = 3$ has been chosen, the multiplication factors $b[m,k]$ are stored in circulating shift registers 5(0) — 5(N−1). These shift registers are each provided with $r = 3$ shift register sections which are each arranged for storing a multi-bit multiplying factor $b(m.k)$. The output of each of these shift registers is connected to its input and an input of the associated multiplying device 3(.) The contents of each of these shift registers 5(.) are circulated once within an input sampling period T under the control of shift pulses. Also these shift pulses for the shift registers 5(,) are derived from the pulse generator 2.

More particularly the shift register sections of the register 5(0) comprise in the figure from the top downwards the multiplication factors $b(0,0)$, $b(1,0)$ $b(2,0)$ respectively; those of the register 5(1) the multiplication factors $b(0,1)$, $b(1,1)$ $b(2,1)$ respectively; those of the register 5(N−1) the multiplication factors $b(0,N-1)$, $b(1,N-1)$, $b(2,N-1)$ respectively. Thus, at a given moment the set of multiplication factors $b[m,k]$ is applied to the multiplying devices 3(.).

When in the storage sections 1(0) — 1(N−1) the input code words $x(nT)$, $x[(n-1)T]$, $x[(n-2)T]$ . . . $x[(n-N+1)T]$ are stored respectively, these code words are first multiplied by the multiplication factors $b(0,k)$ with $k = 0, 1 \ldots, N-1$ respectively. The resulting N product code words which are added in the adder 4. Under the control of a read pulse supplied by the pulse generator 2 the contents of this adder device is now read. In the embodiment shown the contents of this adder device is transferred into a shift register 6 which can be emptied in a known manner under the control of shift pulses. So the adder 4 supplies the output code word $y(nT)$. In contradistinction to the known interpolating digital filter, for example as described in the Dutch Patent Application of ref. 3, the adder is not reset to zero after its contents is transferred to the register 6 so that its content remains equal to $$y(nT) = \sum_{k=0}^{N-1} b(0,k) \cdot x(n-k) \cdot$$

Now the code words $x(nT) \ldots, x(n-N+1)T$ are multiplied by the multiplication factors $b(1,k)$ where $k = 0, 1, 2, \ldots, N-1$, and the N product code words thus obtained are added to $y(nT)$ in the adder 4. Now this adder 4 supplies the output code word $$y[(n + 1/r)T] = y(nT) + \sum_{k=0}^{N-1} b(1,k) \times [(n-k)T] \cdot$$

With the set of multiplication factors $b[2,k]$ the adder supplies the output code word $$y[(n + 2/r)T] = y[(n + 1/r)T] + \sum_{k=0}^{N-1} b(2,k) \times [(n-k)T \cdot]$$

Only when all sets of multiplication factors $b[m,k]$ have been supplied to the multiplying devices and the last output code word $$y[\{n + (r-1)/r\}T] = y[\{n + (r-2)/r\}T] + \sum_{k=0}^{N-1} b(r-1,k) \cdot \times [(n-k)T]$$

-continued $$= \sum_{m=0}^{r-1} \sum_{k=0}^{N-1} b(m,k) \times [(n-k)T]$$

is produced by the adder 4 the pulse generator applies a reset pulse to adder 4.

As known, the output code words $y(nT)$, $y[(n+1/r)T], \ldots, y[\{n+(r-1)/r\}T]$ specified above all occur in an interpolating digital filter within an input sampling period $T=1/f_1$. After the last output code word has been determined and the adder has been reset a new input code word $x[(n+1)T]$ is entered into the storage element 1(0) whilst simultaneously the code words already present are shifted one place and the oldest code word $x[(n-N+1)T]$ disappears from the cascade circuit 1(0) − 1(N−1). The series of processes described above is now repeated in the same sequence on the new series of input code words $x[(n+1)T]$, $x(nT), \ldots, x[(n-N+2)T]$.

As noted before, the various control pulses are derived from the pulse generator 2. As indicated in the figure this pulse generator 2 comprises a clock pulse oscillator 7 which produces clock pulses with a frequency of, for example $(r+4)f_1$ which in the embodiment shown corresponds to $5f_1$. These clock pulses are applied to a modulo-7-counter 8 having, for example, three counting stages. By means of a decoding network which is shown in the figure by the hatched area 9 and by means of AND-gates 10, 11, 12, 13, the counter positions are decoded.

If, more particularly, the counter 8 is set to 000 by a first clock pulse then the AND-gate 10 produces an output pulse which is applied as a shift pulse to the storage sections 1(.). Now also AND-gate 11 produces an output pulse which is applied as a shift pulse to the storage sections of the circulating shift registers 5(.). A next clock pulse sets the counter to 001 and a pulse is produced by the AND-gate 12, in response to which pulse the contents of the adder 4 is transferred to the register 6 without this adder being reset to zero. The next clock pulse sets the counter to 010 and AND-gate 11 produces a pulse again. A fourth clock pulse within the cycle sets the counter to 011 and AND-gate 12 produces a transfer pulse again. The fifth clock pulse sets the counter to 100 in response to which AND-gate 11 produces another pulse. The sixth clock pulse within the cycle sets the counter to 101 in response to which counter state AND-gate 12 produces another transfer pulse. The adder 4 is now reset by the occurrence of the seventh clock pulse which sets the counter 8 to 110. Namely, with this counter state the AND-gate 13 produces an output pulse. A next clock pulse of the oscillator 7 sets the counter 8 again to 000, which causes the contents of the storage sections 1(.) to be shifted one place and a new input code word to be written into the section 1(0). At the same time the set of multiplication factors $b[0,k]$ is supplied to the multipliers 3(.) whereafter the process described above is repeated.

THE MUTUAL RELATIONSHIP OF THE MULTIPLICATION FACTORS

In the above it has already been indicated that an output code word $y[(n+m/r)T]$ of the interpolating filter is obtained by adding a partial sum $$\sum_{k=0}^{N-1} b(m,k) \times [n-k)T]$$

to the contents of the adder.

To determine such a partial sum a set of multiplication factors $b[m,k]$ which is characterized by the value of $m$ is used, the $r$ sets of multiplication factors which are used in various input sampling periods being equal.

In the known interpolating digital filters sets of multiplication factors $a[m,k]$ where $m = 0, 1, 2, \ldots, r-1$ and $k = 0, 1, 2, \ldots N-1$ are used which are equal in magnitude to the individual samples of a series of samples of the impulse response of the desired filter. These samples have then, as usual, been quantized and coded into a binary number.

The relation which exists between the various sets of multiplication factors $a[m,k]$ has already been explained in detail in the Dutch Patent Application mentioned in ref. 3. For completeness this relation will again be briefly explained with reference to the pulse response shown in FIG. 2. The number of storage sections 1(.) is assumed to be equal to $N = 19$.

Figure 2:
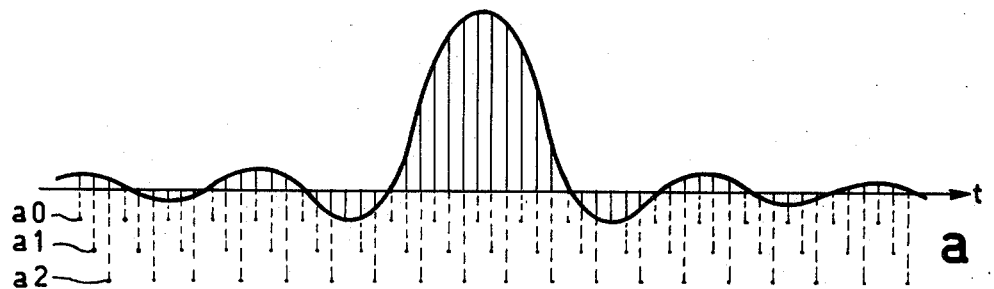
FIG. 2 shows some time diagrams to explain the relation between the multiplying coefficients which belong to different sets.
Figure 2:
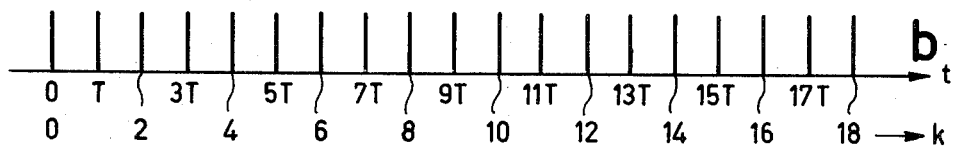

The pulse response shown in FIG. 2 at $a$ and which is limited to the time interval 0 to 19T is that of an ideal low-pass filter having a cut-off frequency $\omega_o/2$. As known this impulse response has a form which can mathematically be represented by $$\frac{\omega_o}{2} \cdot \frac{\sin(t-9T)\omega_o/2}{(t-3T)\omega_o}$$

In the first place this low-pass filter is considered to be non-interpolating, that is to say that its input-and output sampling frequencies are equal. Assuming this sampling frequency to be equal to four times the cut-off frequency of the filter the sampling period is then equal to $T = \pi/\omega_o$.

To determine the multiplication factors $a[m,k]$ the impulse response of the filter is sampled with the series of sampling pulses which are shown at $b$ in FIG. 2. It is assumed that these sampling pulses occur at the instants $t = kT$. So this series ca be mathematically represented by:

$$\sum_{k=-\infty}^{\infty} \delta(t-kT)$$

The instantaneous values of the impulse response at these instants $kT$ where $k = 0, 1, 2, \ldots 18$ now together constitute the sets of multiplication factors $a[0,k]$ and are indicated by $a0$ at $a$ in FIG. 2.

If this low-pass filter is used as an interpolating filter having an interpolation factor $r = 3$ then a set $a[1,k]$ and a set $a[2,k]$ are used besides the set of multiplication factors $a[0,k]$. These sets $a[1,k]$ and $a[2,k]$ are each obtained by sampling the pulse response with a series of sampling pulses which occur with the same period T as the series which is indicated at $b$ in FIG. 2, however, these series are shifted relative to the series of sampling pulses shown, over a distance T/3 and 2T/3 respectively. The instantaneous values of the impulse response at said sampling instants are indicated by $a1$ for the set $a[1,k]$ and by $a2$ for the set $a[2,k]$ at $a$ in FIG. 2.

As can be seen from the impulse response shown at $a$ in FIG. 2, in an interpolating non-recursive digital filter the instantaneous values $a0$, $a1$ and $a2$ of the pulse response within a sampling period, that is to say in the period between the sampling pulse which occurs at the instants $kT$ and $(k+1)T$ which are shown at $b$ in FIG. 2 do not greatly differ from one another. They are namely not far apart in time and furthermore the maximum slope of the impulse response is limited.

In accordance with the invention the multiplication factors $b(m,k)$ are now used which are related to the abovementioned multiplication factors $a(m,k)$ in the following manner.

$$b(0,k) = a(0,k) \text{ where } k = 0, 1, 2, \ldots N-1$$

$$b(m,k) = a(m,k) - a(m-1-k) \text{ where } m \neq 0 \text{ and } k = 0, 1, 2, \ldots N-1.$$

In other words the set of multiplication factors which in the filter shown in FIG. 1 is used immediately after a new input signal sample has been written into the storage section 1(0), is equal to the set $a[0,k]$. The use of this set furnishes the first output signal sample $y(nT)$ within the input sampling period under consideration. To obtain the second output signal sample within this input sampling period multiplication factors $b(1,k)$ are used whose magnitude is given by $b(1,k) = a(1,k) - a(0,k)$ so: $b(1,0) = a(1,0) - a(0,0)$; $b(1,1) = a(1,1) - a(0,1)$ etc. To obtain the third output signal sample within the input sampling period multiplication factors $b(2,k)$ are used whose magnitude is given by $$b(2,k) = a(2,k) - a(1,k) \text{ so: } b(2,0) = a(2,0) - a(1,0)$$

$$b(2,1) = a(2,1) - a(1,1) \text{ etc.}$$

As these multiplication factors $b(m,k)$ where $m \neq 0$ can be coded with smaller word length than the factors $a(m,k)$ a saving in storage capacity for storing these multiplication factors $b(m,k)$ is obtained and also less time is required for performing a multiplication such as $x(nT)b(m,k)$ than for the corresponding multiplication $x(nT) \cdot a(m,k)$.

However, by coding the impulse response in this manner the magnitude of an output signal sample $y[(n+m/r)T]$ now depends on the preceding output signal sample $y[\{n+(m-1)/r\}T]$. Consequently, as has already been indicated with reference to FIG. 1, the adder 4 is not reset to its zero position before the last output signal sample $y[\{n+(r-1)/r\}T]$ is transferred from the adder 4 to the register 6.

GENERAL REMARKS

Besides in the manner as shown in FIG. 1 a non-recursive digital filter can also be constructed in the manner as described in ref. 4. In that case the input signal samples are written into a circulating shift register with N storage sections which are each arranged for storing a complete input signal sample $x(nT)$. Then these input signal samples are supplied one after the other to a multiplying device together with a multiplication factor and the product obtained is supplied to an accumulator. If the filter constructed in this manner is used as interpolating filter then, as already indicated in ref. 3 the shift frequency to the shift register amounts to at least $r(N+1)f_1$. Also in the filter constructed in this way the multiplication factors can be coded in accordance with the invention whilst then again the accumulator is reset to zero only shortly before a new input signal sample is written into the shift register.

Although in the embodiment of FIG. 1 the multiplication factors have been stored in circulating shift registers 5(.) they can also be stored in, for example, a ROM which, as known, offers exceptional advantages in the filter described above which has a circulating shift register for the storage of the input signal samples.

It should also be noted that with a modified construction of the pulse generator 2 the input signal samples $x(nT)$ can also be stored in a RAM instead of in a shift register.

Finally it should be noted that the bits of the numbers $x(nT)$ and of the multiplication factors may occur both in series and in parallel and that they can be stored in the various storage elements in this form. However, these forms do not effect the essence of the invention. This also applies to the manner of representing these numbers which, as known, may be represented in the so-called sign-magnitude representation, the 1-complements or the 2-complements representation.

What is claimed is:

1. An interpolating non-recursive digital filter apparatus for producing an output digital signal $\{y(i)\}$ having associated therewith a predetermined output sampling rate $r/T$, in response to a digital input signal $\{x(n)\}$ having associated therewith an input sampling rate $1/T$, whereby $i, n = 0, \pm 1, \pm 2, \ldots$ and whereby $r$ is a positive integer, said non-recursive digital filter apparatus having associated therewith $rN$ predetermined impulse response values $a(j)$, $N$ being a positive integer and $j = 0, 1, 2, 3, \ldots rN$, said apparatus comprising:

storage means for receiving and storing N successive input signal samples $x(n), x(n-1), x(n-2), \ldots x(n-N+1)$;

memory means having $r$ addressable memory fields $M_m$, whereby $m = 0, 1, 2, 3, \ldots r-1$, each memory field $M_m$ having N addressable memory locations for storing impulse response value differences $b(m,k) = a(m+kr) - a[(m-1)+kr]$ wherein $k = 0, 1, 2, 3, \ldots N-1$;

means operatively connected to said memory means for addressing said memory fields and said memory locations;

multiplier means coupled to the storage means and the memory means and sequentially responsive to each impulse response value difference subset $b(m,0), b(m,1), b(m,2), \ldots b(m,N-1)$ over the range $0 \leq m < r$ to produce signal subsets $b(m,0)x(n)$, $b(m,1)x(n-1)$, $b(m,2)x(n-2)$, $b(m,N-1)x(n-N+1)$;

accumulator means for combining the products in the signal subsets to form the output signal sample $$y(rn+m) = \sum_{q=0}^{m} \sum_{k=0}^{N-1} b(q,k)x(n-k) \text{ ;}$$

means for applying the signal subsets from said multiplier means to said accumulator; and means for resetting the accumulator means once every input sampling period T.

2. An apparatus as claimed in claim 1, further comprising a buffer memory, the output of the accumulator means being connected to said buffer memory for storing at least one output signal sample $y(rn+m)$.

3. An apparatus as claimed in claim 2, further comprising a clock pulse generator coupled to the said buffer memory for controlling the storage time of the buffer memory.

* * * * *

UNITED STATES PATENT AND TRADEMARK OFFICE
CERTIFICATE OF CORRECTION

PATENT NO. : 4052605

DATED : October 4, 1977

INVENTOR(S) : LUDWIG DESIRE JOHAN EGGERMONT

It is certified that error appears in the above-identified patent and that said Letters Patent are hereby corrected as shown below:

Col. 1, line 58, "y[n+(m+1)/r)T]T]" should read

-- y[(n+(m+1)/r)T] --.

line 61, "(1)" should read -- 1) --.

Col. 2, line 56, "y[(n+m/r)T]T]" should read

-- y[(n+m/r)T] --.

Col. 6, line 39, "ca" should read -- can --.

Signed and Sealed this

Seventh Day of March 1978

[SEAL]

Attest:

RUTH C. MASON
Attesting Officer

LUTRELLE F. PARKER
Acting Commissioner of Patents and Trademarks